United States Patent
Hu et al.

(10) Patent No.: US 10,263,334 B2
(45) Date of Patent: Apr. 16, 2019

(54) ANTENNA DEVICE AND MOBILE TERMINAL

(71) Applicant: GUANGDONG OPPO MOBILE TELECOMMUNICATIONS CORP., LTD., Dongguan, Guangdong (CN)

(72) Inventors: Shasha Hu, Guangdong (CN); Tianping Liang, Guangdong (CN); Liang Gu, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/973,201

(22) Filed: May 7, 2018

(65) Prior Publication Data
US 2018/0254542 A1 Sep. 6, 2018

Related U.S. Application Data

(63) Continuation of application No. 15/753,330, filed as application No. PCT/CN2016/085548 on Jun. 13, 2016.

(30) Foreign Application Priority Data

Mar. 18, 2016 (CN) .......................... 2016 1 0161287
Mar. 18, 2016 (CN) .......................... 2016 1 0161288
Apr. 20, 2016 (CN) .......................... 2016 1 0248724

(51) Int. Cl.
*H01Q 1/24* (2006.01)
*H01Q 5/321* (2015.01)
(Continued)

(52) U.S. Cl.
CPC ............. *H01Q 5/321* (2015.01); *H01Q 1/243* (2013.01); *H01Q 1/36* (2013.01); *H01Q 1/44* (2013.01); *H05K 5/04* (2013.01); *H01Q 1/50* (2013.01)

(58) Field of Classification Search
CPC .......... H01Q 5/321; H01Q 1/36; H01Q 1/243; H01Q 1/44; H01Q 1/50
See application file for complete search history.

(56) References Cited

U.S. PATENT DOCUMENTS 10,084,234 B2  9/2018  Hu et al.
2012/0009983 A1  1/2012  Mow et al.
(Continued)

FOREIGN PATENT DOCUMENTS

CA  2953629 A1  10/2015
CN  102142855 A  8/2011
(Continued)

OTHER PUBLICATIONS

Chinese Patent Application No. 201610161287.5 First Office Action dated May 17, 2017, 4 pages.
(Continued)

*Primary Examiner* — Dieu Hien T Duong
(74) *Attorney, Agent, or Firm* — Lathrop Gage LLP

(57) ABSTRACT

The present disclosure provides an antenna device including: a peripheral frame made of a signal shielding material and provided with at least two micro seam bands which partition the peripheral frame into at least two frame bodies, the frame bodies including a first antenna, the micro seam band having at least one micro seam; a first matching circuit electrically coupled to the first antenna; and a first radio-frequency receiving and emitting circuit electrically coupled to the first matching circuit. The frame bodies further includes a second antenna including a second matching
(Continued)

circuit and a second radio-frequency receiving and emitting circuit, the second matching circuit is electrically coupled between the second antenna and the second radio-frequency receiving and emitting circuit, and the two radio-frequency receiving and emitting circuits deal with different radio-frequency signals. The micro seam band further includes a frame strip. The present disclosure further provides a mobile terminal.

18 Claims, 19 Drawing Sheets

(51) Int. Cl.
*H01Q 1/36* (2006.01)
*H01Q 1/44* (2006.01)
*H05K 5/04* (2006.01)
*H01Q 1/50* (2006.01)

(56) References Cited

U.S. PATENT DOCUMENTS

| | | | |
|---|---|---|---|
| 2014/0078008 | A1 | 3/2014 | Kang et al. |
| 2015/0171916 | A1* | 6/2015 | Asrani .......... H04B 1/68 |
| | | | 455/575.7 |
| 2016/0064820 | A1 | 3/2016 | Kim et al. |
| 2017/0149118 | A1* | 5/2017 | Wang .......... H01Q 1/243 |
| 2017/0373388 | A1* | 12/2017 | Wang .......... H01Q 1/44 |

FOREIGN PATENT DOCUMENTS

| | | |
|---|---|---|
| CN | 103390793 A | 11/2013 |
| CN | 203775569 U | 8/2014 |
| CN | 104103888 A | 10/2014 |
| CN | 104584324 A | 4/2015 |
| CN | 104681929 A | 6/2015 |
| CN | 104953292 A | 9/2015 |
| CN | 105655689 A | 6/2016 |
| CN | 105655704 A | 6/2016 |
| CN | 105655705 A | 6/2016 |
| CN | 105655706 A | 6/2016 |
| EP | 2493009 A2 | 8/2012 |
| WO | WO 2012096894 A2 | 7/2012 |

OTHER PUBLICATIONS

Chinese Patent Application No. 201610161287.5 English translation of First Office Action dated May 17, 2017, 6 pages.
Chinese Patent Application No. 201610161287.5 Second Office Action dated Jul. 24, 2017, 4 pages.
Chinese Patent Application No. 201610161287.5 English translation of Second Office Action dated Jul. 24,2017, 6 pages.
Chinese Patent Application No. 201610161287.5 Notification to Grant Patent Right for Invention dated Oct. 9, 2017, 1 page.
Chinese Patent Application No. 201610161287.5 English translation of Notification to Grant Patent Right for Invention dated Oct. 9, 2017, 2 pages.
Chinese Patent Application No. 201610161287.5 English translation of Allowed Claims as of Oct. 9, 2017, 2 pages.
PCT/CN2016/085548 English Translation of the International Search Report and Written Opinion dated Dec. 15, 2016, 11 pp.
PCT/CN2016/085548 International Search Report and Written Opinion dated Dec. 15, 2016, 14 pp.
European Patent Application No. 16894062.5, Extended Search and Opinion dated Aug. 28, 2018, 8 pp.
U.S. Appl. No. 15/753,330, Non final Office Action dated Oct. 4, 2018, 10 pp.

* cited by examiner

ANTENNA DEVICE AND MOBILE TERMINAL

CROSS-REFERENCE TO RELATED APPLICATIONS

The present application is a continuation of U.S. National Phase application Ser. No. 15/753,330, with a filing date of Feb. 18, 2018, which is a national phase entry under 35 USC § 371 of International Application PCT/CN2016/085548, filed Jun 13, 2016, which claims the benefit of and priority to Chinese Patent Application No. 201610161288.X, filed Mar. 18, 2016, Chinese Patent Application No. 201610161287.5, filed Mar. 18, 2016, and Chinese Patent Application No. 201610248724.7, filed Apr. 20, 2016, the entire disclosures of which are incorporated herein by reference.

FIELD

The present disclosure relates to a technical field of electronic products, and especially to an antenna device and a mobile terminal.

BACKGROUND

With the development of science and technology and users' increasing demands on signaling of electronic products, mobile terminals having an antenna, such as a mobile phone, currently on the market usually use a metal housing to provide texture while ensuring the use strength, so as to improve the user's experience. As we all know, the metal is a signal shielding material; in order to prevent a signal shielding effect of the metal housing from influencing the antenna efficiency, the housing is usually designed to adopt a combination of metal and non-metallic areas, the antenna structure is located in the non-metallic area, and the non-metallic area is usually arranged at two ends of the mobile terminal and located outside the shielding display area. A circuit board is arranged in the non-metallic area, electronic components and signal transceiving units are arranged on the circuit board, and antennas of the mobile terminal are usually arranged in the non-metallic area so as to receive and emit signals through the non-metallic area. In the conventional structure, a design of a radiator of the antenna is limited, resulting in a lower radiation efficiency of the antenna.

SUMMARY

The present disclosure provides an antenna device, including: a peripheral frame, the peripheral frame being made of a signal shielding material and formed to be end-to-end, the peripheral frame being provided with at least two micro seam bands, the at least two micro seam bands partitioning the peripheral frame into at least two frame bodies independent from each other, the at least two frame bodies including a first antenna, the micro seam band having at least one micro seam, and a width of the micro seam being smaller than or equal to 0.2 mm; a first matching circuit, the first matching circuit being electrically coupled to the first antenna; and a first radio-frequency receiving and emitting circuit, the first radio-frequency receiving and emitting circuit being electrically coupled to the first matching circuit. The at least wo frame bodies further includes a second antenna, the antenna device further includes a second matching circuit and a second radio-frequency receiving and emitting circuit, the second matching circuit is electrically coupled between the second antenna and the second radio-frequency receiving and emitting circuit, and the second radio-frequency receiving and emitting circuit and the first radio-frequency receiving and emitting circuit are configured to deal with different radio-frequency signals, such that the antenna device integrates multiple functional antennas on the same peripheral frame. The micro seam band further includes a frame strip formed between adjacent micro seams, the micro seam band is an integral structure including both the frame strip and the micro seam, and the micro seam band is embedded in the peripheral frame.

The present disclosure further provides a mobile terminal including the antenna device as mentioned above.

BRIEF DESCRIPTION OF THE DRAWINGS

To illustrate the technical solutions in the present disclosure more clearly, the following briefly introduces the accompanying drawings required for describing the embodiments. Apparently, the accompanying drawings in the following description show merely some embodiments of the present disclosure, those ordinarily skilled in the related art can obtain other drawings in the premise of not paying creative work.

DETAILED DESCRIPTION

The technical solutions in the embodiments of the present disclosure will be described clearly and completely below with reference to the accompanying drawings in the embodiments of the present disclosure. Apparently, the described embodiments are merely some but not all embodiments of the present disclosure. All other embodiments obtained by persons of ordinary skill in the art based on the embodiments of the present disclosure without creative efforts shall fall into the protection scope of the present disclosure.

The present disclosure provides an antenna device, including: a peripheral frame, the peripheral frame being made of a signal shielding material and formed to be end-to-end, the peripheral frame being provided with at least two micro seam bands, the at least two micro seam bands partitioning the peripheral frame into at least two frame bodies independent from each other, the at least two frame bodies including a first antenna, the micro seam band having at least one micro seam, and a width of the micro seam being smaller than or equal to 0.2 mm; a first matching circuit, the first matching circuit being electrically coupled to the first antenna; and a first radio-frequency receiving and emitting circuit, the first radio-frequency receiving and emitting circuit being electrically coupled to the first matching circuit. The at least two frame bodies further includes a second antenna, the antenna device further includes a second matching circuit and a second radio-frequency receiving and emitting circuit, the second matching circuit is electrically coupled between the second antenna and the second radio-frequency receiving and emitting circuit, and the second radio-frequency receiving and emitting circuit and the first radio-frequency receiving and emitting circuit are configured to deal with different radio-frequency signals, such that the antenna device integrates multiple functional antennas on the same peripheral frame. The micro seam band further includes a frame strip formed between adjacent micro seams, the micro seam band is an integral structure including both the frame strip and the micro seam, and the micro seam band is embedded in the peripheral frame.

The present disclosure further provides a mobile terminal including the antenna device as mentioned above.

Figure 1:
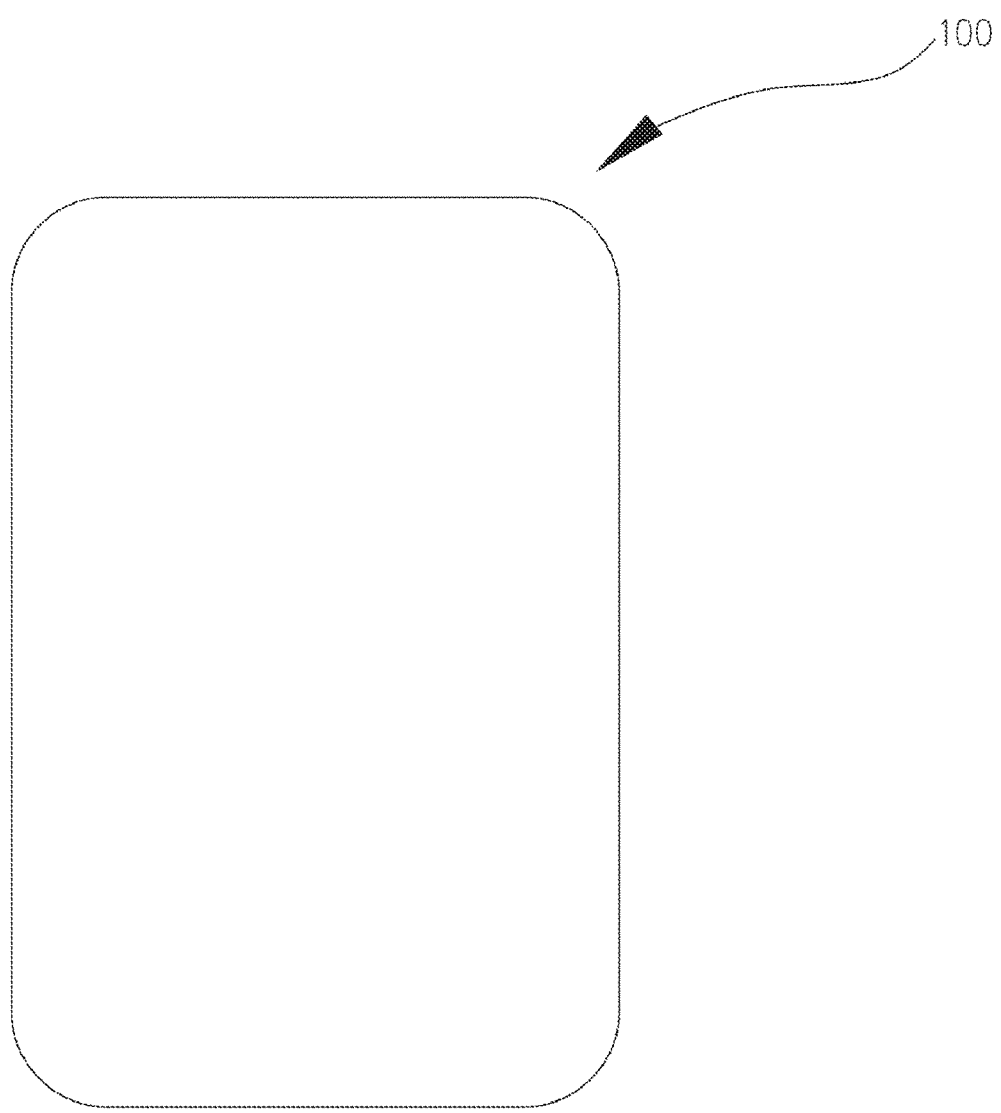
FIG. 1 is a schematic view of a mobile terminal provided in embodiments of the present disclosure.

As illustrated in FIG. 1, the present disclosure relates to a mobile terminal 100, an antenna device is provided in the mobile terminal 100, and the mobile terminal 100 can be a smart phone, a tablet computer and etc. The mobile terminal 100 includes a display screen and a metal housing. A non-display area is usually provided at a top and/or bottom of the display screen of the mobile terminal 100, and electronic elements such as a camera unit, a telephone receiver, a Bluetooth unit, a finger recognition unit and the like are provided in the non-display area. A main board of the mobile terminal 100 is also arranged in the non-display area.

Figure 2:
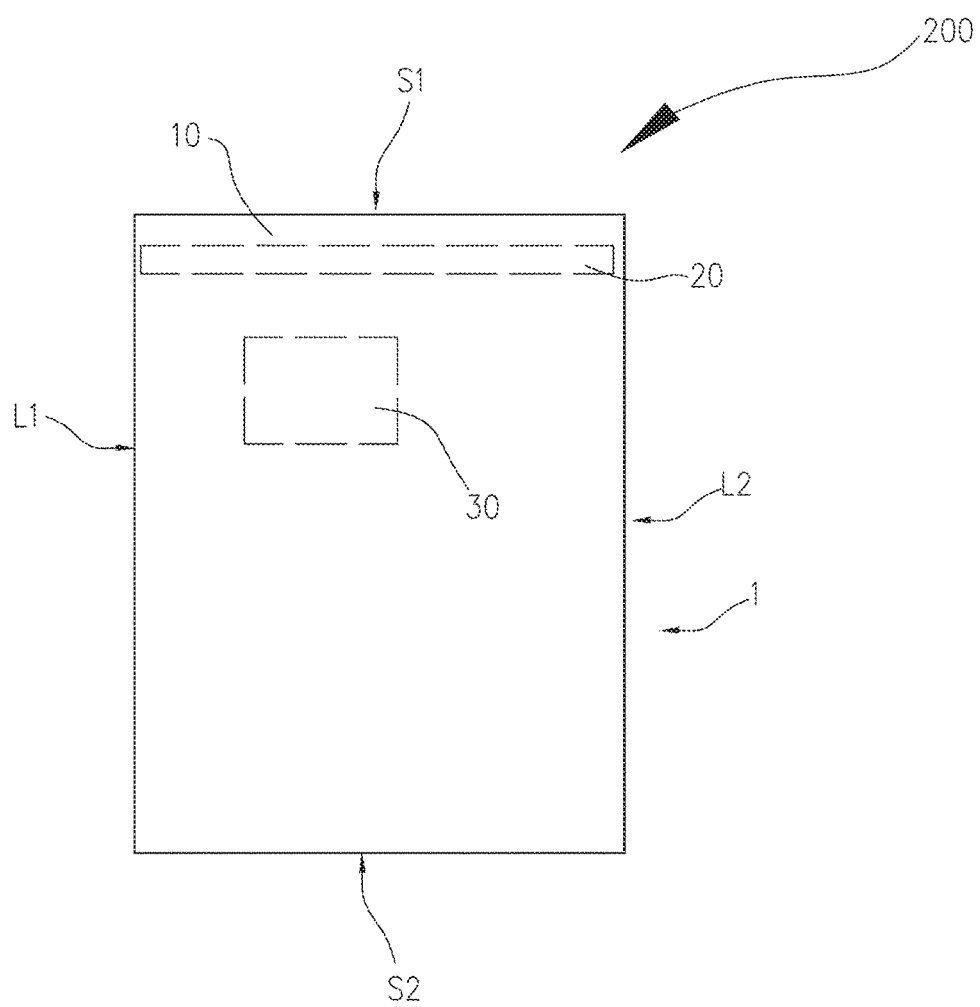
FIG. 2 is a schematic view of an antenna device provided in a first embodiment of the present disclosure.

As illustrated in FIG. 2, which is a schematic view of an antenna device 200 provided in a first embodiment of the present disclosure, the antenna device 200 includes a metal housing 1 and a radiating circuit 30. The metal housing 1 includes a first long edge L1 and a second long edge L2 arranged opposite to each other, and a first short edge S1 and a second short edge S2 arranged opposite to each other. The first short edge S1 and the second short edge S2 are connected between the first long edge L1 and the second long edge L2. A partitioning seam 20 is provided in the metal housing 1 so that at least one radiating part 10 is formed in the metal housing 1. The radiating circuit 30 is provided in the metal housing 1 so that the at least one radiating part 10 of the metal housing 1 serves as a radiator of the antenna device 200. With the combination of the partitioning seam 20 and the radiating circuit 30, the metal housing 1 is enabled to be the radiator, thus radiation efficiency of the antenna device 200 is increased. It is to be noted that FIG. 2 is a simple schematic view of the antenna device 200, and for specific structure forms of the metal housing 1, the partitioning seam 20, and the radiating circuit 30 in the antenna device 200, reference may be made to the following embodiments.

Figure 3:
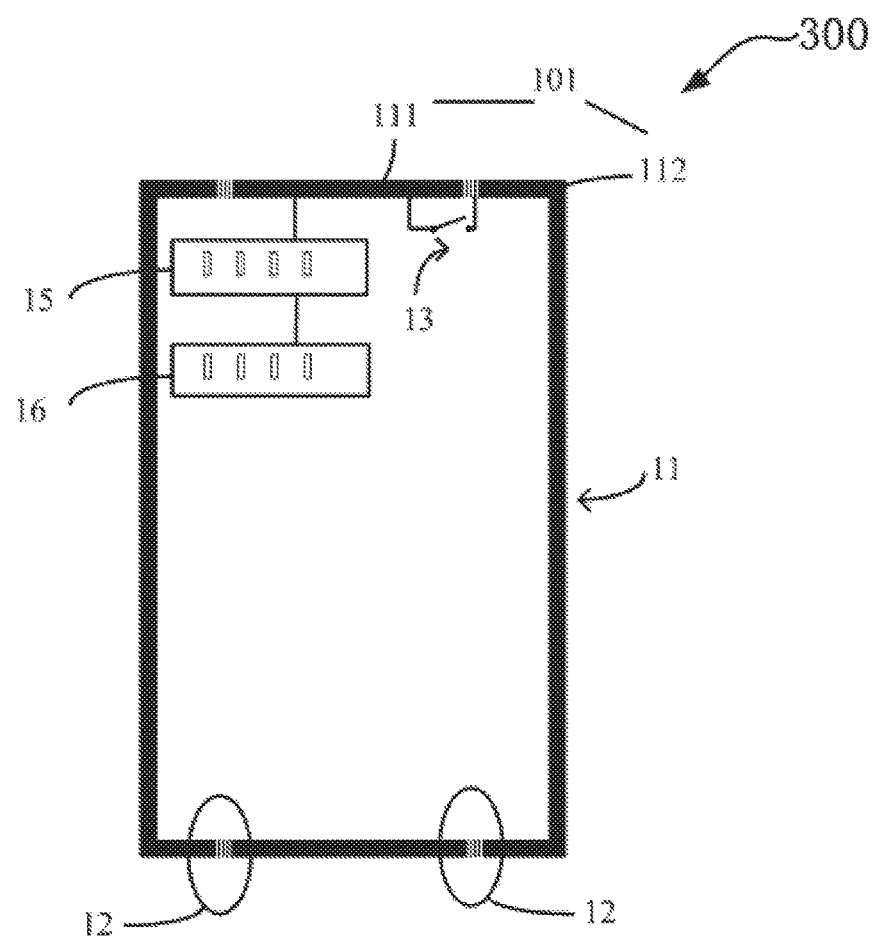
FIG. 3 is a schematic view of an antenna device provided in a second embodiment of the present disclosure.
Figure 4:
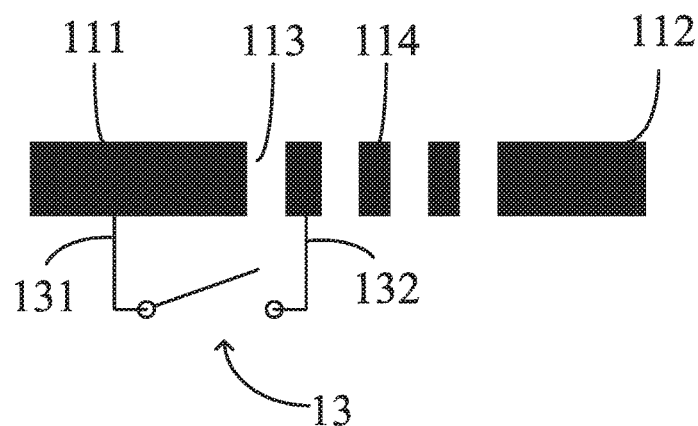
FIG. 4 is an enlarged schematic view of a micro seam band and a switch electrically coupled with each other illustrated in FIG. 3.

Referring to FIG. 3 and FIG. 4, which is an antenna device 300 provided in a second embodiment of the present disclosure. In the antenna device 300, a metal housing 11 is an end-to-end peripheral frame. The partitioning seam includes a micro seam band 12, the micro seam band 12 has at least two metal strips 114 juxtaposed and spaced apart from each other, the metal housing 11 is partitioned by the micro seam band 12 to form at least one frame body 101, and the frame body 101 is the radiating part. The radiating circuit includes a switch 13, the switch 13 includes a first end 131 and a second end 132, the first end 131 is electrically coupled to the frame body 101 partitioned by the micro seam band 12, and the second end 132 is electrically coupled to the metal strips 114.

The radiating circuit further includes a matching circuit 15 and a radio-frequency circuit 16, the matching circuit 15 is arranged between the radio-frequency circuit 16 and the frame body 101, and the matching circuit 15 is electrically coupled with both of the radio-frequency circuit 16 and the frame body 101.

Specifically, as illustrated in FIG. 3, in an embodiment, four micro seam bands 12 are provided in the metal housing 11. Every two micro seam bands 12 form the frame body 101 serving as an independent antenna, and the frame body 101 includes at least a first frame body 111 and a second frame body 112. The matching circuit 15 is located between the radio-frequency circuit 16 and the first frame body 111 and electrically coupled with the radio-frequency circuit 16 and the first frame body 111. The matching circuit 15 is used to match impedance of the antenna so as to decrease echo return loss caused by impendence mismatch. In other embodiments, the number of the micro seam band 12 can be determined by actual demands. For example, one or two or three micro seam bands 12 can be provided.

As illustrated in FIG. 4, the micro seam band 12 is formed by at least two micro seams 113 arranged spaced apart, and the metal strips 114 exist between two adjacent micro seams 113. In the present embodiment, a case where four micro seams 113 and three metal strips 114 are provided is described as an example. In other embodiments, the numbers of the micro seams 113 and the metal strips 114 are not limited to this and are determined by specific design requirements.

In the present embodiment, a width of the micro seam band 12 is 1.5 mm-5.0 mm, a width of each micro seam 113 in the micro seam band 12 is 0.05 mm-0.3 mm, and the micro seams 113 are equidistantly spaced apart. The equidistantly spaced arrangement of the micro seams 113 is easy to process. In other embodiments, widths of the micro seam band 12 and the micro seams 113 are determined by the specific design requirements and technology precision, and/or the micro seams 113 are spaced apart at unequal intervals. The width of the micro seam band 12 can be 1.5 mm or 5.0 mm, and a seam width of the micro seams 113 in the micro seam band 12 can be 0.05 mm or 0.3 mm.

As illustrated in FIG. 4, the switch 13 includes the first end 131 and the second end 132. The first end 131 of the switch 13 is electrically coupled with the first frame body 111, and the second end 132 is electrically coupled with one metal strip 114 in the micro seam band 12. When the switch 13 is closed, an equivalent length of the antenna is lengthened, and a resonant frequency of the antenna of the first frame body 111 is decreased. When the switch 13 is open, the equivalent length of the antenna is shortened, and the resonant frequency of the antenna increases compared with the resonant frequency in condition that the switch 13 is closed. A low-frequency bandwidth of the antenna changes along with a change of the resonant frequency of the antenna. Thus, with the closed or open states of the switch, different low-frequency bandwidths can be obtained, which not only expands the low-frequency bandwidth, but also increases a freedom degree of antenna performance adjustment. In the present embodiment, the switch 13 is a single-pole single-throw switch, the second end 132 of the switch 13 can be only electrically coupled to one metal strip 114, and thus only one low-frequency bandwidth can be expanded.

Figure 5:
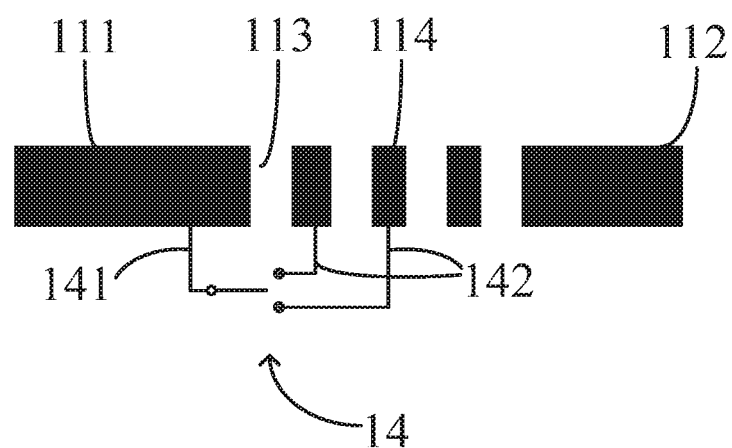
FIG. 5 is an enlarged schematic view of a micro seam band and a switch electrically coupled with each other in an antenna device provided by other examples of the second embodiment.

Certainly, in other embodiments, the switch can also be other types of switches. As illustrated in FIG. 5, the switch 13 is a single-pole dual-throw switch, and the switch 13 includes two second ends 142. The two second ends 142 of the switch 13 are electrically coupled to two different metal strips 114 separately. In the present embodiment, with different on-off states of the switch 13, two low-frequency bandwidths can be expanded. In other embodiments, the switch 13 can be other types of single-pole multi-throw switches. For example, the switch 13 is a single-pole three-throw switch. The switch 13 includes a plurality of second ends 132, and the plurality of second ends 132 can be electrically coupled to more different metal strips 114 separately, thus the low-frequency bandwidths can be expanded further so as to increase the freedom degree of the antenna performance adjustment.

Further, in the above-mentioned embodiment, an inductor or a capacitor element is connected between the switch 13 and the metal strips 114. Providing the inductor or the capacitor can further facilitate the adjustment of the antenna performance. In other embodiments, the number of the switches 13 can be other numbers such as two. The first frame body 111 is electrically coupled with one or a plurality of metal strips 114 of an adjacent micro seam band 12 via one of the two switches 13, and the second frame body 112 is electrically coupled with one or a plurality of metal strips 114 of another adjacent micro seam band 12 via the other of the two switches 13. Thus, the adjustment and expansion of the antenna performance of different antennas all can be performed by the switches.

The first frame body 111 can be a GPS antenna, the second frame body 112 can be a Wi-Fi antenna. Other two frame bodies formed by the partitioning of the four micro seam bands 12 can be a Bluetooth antenna and a near field communication (NFC) antenna.

Accordingly, in the antenna device 300 according to the present disclosure, by providing the micro seam band 12 including at least two metal strips 114 spaced apart for the metal housing 11 which is the peripheral frame, the metal housing 11 is partitioned into at least one frame body 101 serving as the independent antenna and metal strips 114 located between adjacent micro seams, so that two ends of the switch 13 are electrically coupled to the frame body 101 and the metal strips 114. When the on-off states of the switch 13 changes, the equivalent length of the antenna changes, and the resonant frequency of the antenna changes therewith, so that different low-frequency bandwidth can be obtained, thus the low-frequency bandwidth of the antenna device 300 is expanded and the freedom degree of the adjustment of the antenna performance is increased.

Figure 6:
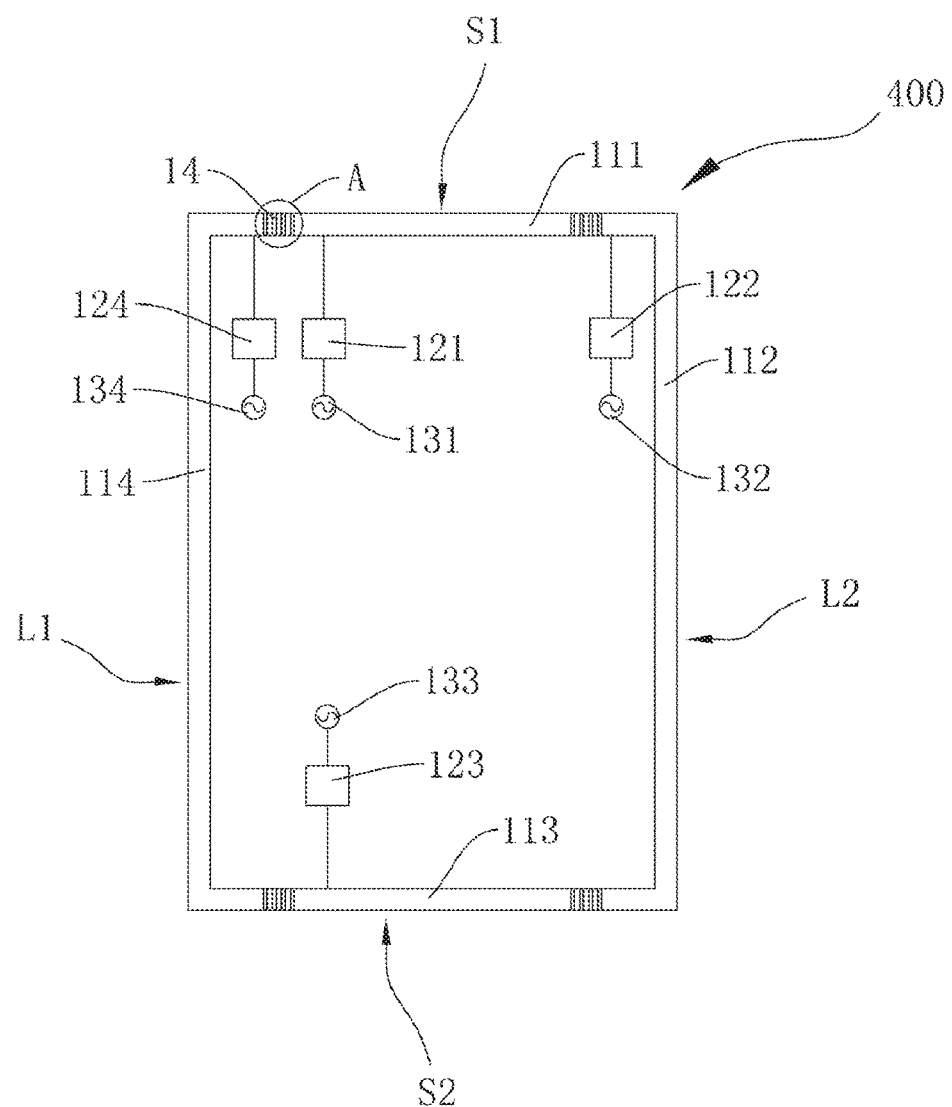
FIG. 6 is a schematic view of an antenna device provided in a third embodiment of the present disclosure.

Referring to FIG. 6, which is an antenna device 400 provided in the third embodiment of the present disclosure. In the antenna device 400, the metal housing 11 is the end-to-end peripheral frame; the peripheral frame is provided with the first long edge L1 and the second long edge L2 arranged opposite to each other, and the first short edge S1 and the second short edge S2 arranged opposite to each other. The first short edge S1 and the second short edge S2 are connected between the first long edge L1 and the second long edge L2. The partitioning seam includes a micro seam band 14, the micro seam band 14 has at least two metal strips juxtaposed and spaced apart from each other, and a micro seam 140 is formed between two adjacent metal strips. The micro seam band 14 partitions the metal housing 11 to form at least one frame body, and the frame body is the radiating part.

At least two micro seam bands 14 are provided in the metal housing 11, and the at least two micro seam bands 14 partition the metal housing 11 into at least two frame bodies. The at least two frame bodies include a first antenna 111, that is, one of the two frame bodies is the first antenna 111. The micro seam band 14 has at least one micro seam 140, and a width T1 of the micro seam 140 is smaller than or equal to 0.2 mm. The radiating circuit includes a first matching circuit 121 and a first radio-frequency receiving and emitting circuit 131, the first matching circuit 121 is electrically coupled to the first antenna 111, and the first radio-frequency receiving and emitting circuit 131 is electrically coupled to the first matching circuit 121. In the antenna device 400, at least two micro seam bands 14 are used to partition the metal housing 11 made of a metal material into at least two frame bodies independent from each other, and one of the two frame bodies is configured as the first antenna 111 to realize an antenna function of the antenna device 400, so that the metal housing 11 is prevented from interfering with the antenna signals. Meanwhile, the micro seam band 14 is formed by at least one micro seam 140, the width T1 of the micro seam 140 is smaller than or equal to 0.2 mm, and the seam smaller than or equal to 0.2 mm is invisible to naked eyes, so the micro seam band 14 can make the mobile terminal applying the antenna device 400 achieve a seamless peripheral frame effect of the entire signal shielding material in the naked eye vision while guaranteeing a partitioning effect. Furthermore, when metal is adopted as the signal shielding material, the mobile terminal applying the antenna device 400 has a more textured appearance.

It should be understood that the first radio-frequency receiving and emitting circuit 131 described in the present embodiment is used to receive and emit a radio-frequency signal and also named as a radio frequency chip. The first matching circuit 121 is used to adjust impedance matching of the first antenna 111 so that the first antenna 111 can receive the radio-frequency signal better.

In the first example, when one micro seam 140 is provided, that is only one micro seam 140 is provided in the micro seam band 14, the width T1 of the micro seam 140 satisfies: $0.1\text{ mm} \leq T1 \leq 0.2\text{ mm}$, so as to guarantee that the micro seam band 14 can smoothly partition the metal housing 11 into at least two frame bodies independent from each other, and the two frame bodies are distant from each other at at least 0.1 mm, so that the partitioning effect is guaranteed.

Figure 7:
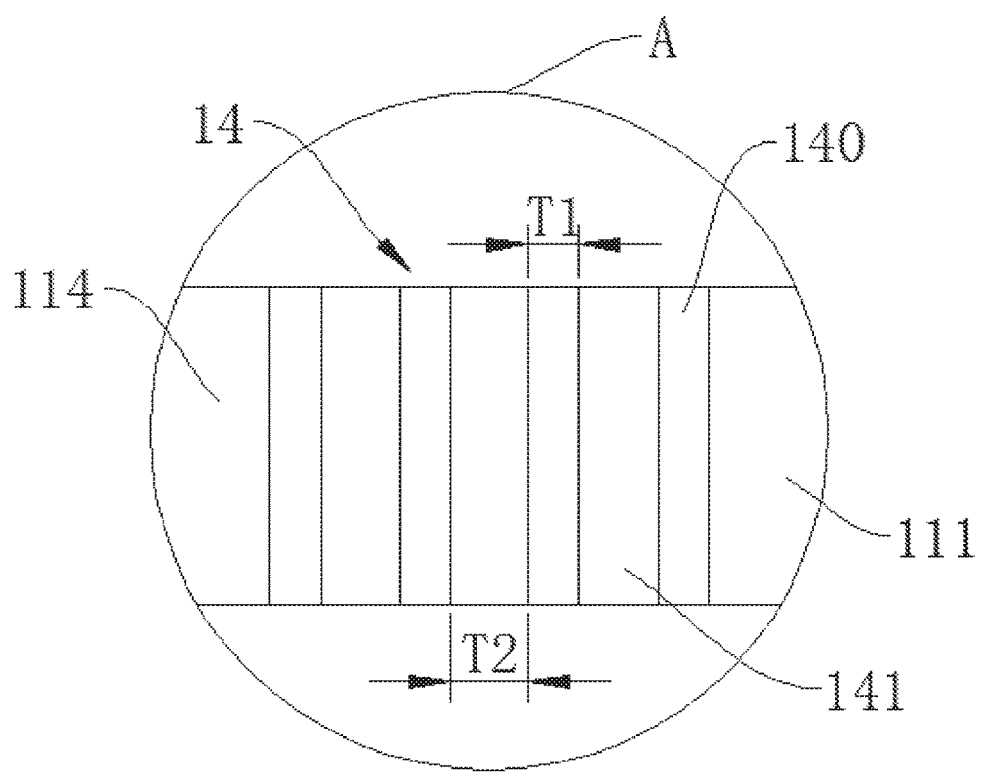
FIG. 7 is an enlarged view of a structure in portion A of FIG. 6.

Referring to FIG. 7, in the second example, when at least two micro seams 140 are provided, that is, when the micro seam band 14 includes at least two micro seams 140, a distance between the adjacent two micro seams 140 is T2, and the micro seam band 14 satisfies: $T2 \geq T1$, so that a ratio of a seam area in the micro seam band 14 is smaller than 50%, which can further guarantee that the mobile terminal applying the antenna device 400 has the seamless peripheral frame effect of the entire signal shielding material in the naked eye vision.

Further, a ratio of the distance T2 between the adjacent micro seams 140 to the width T1 of the micro seam 140 is larger than or equal to 1.2. More preferably, $T2/T1 \geq 2$.

Optionally, the micro seam band 14 includes four micro seams 140, and the width T1 of the micro seam 140 satisfies: $T1 \leq 0.12\text{ mm}$, which makes the effect of being invisible to naked eyes of the micro seam 140 better. Further, T1 is preferably to be 0.04 mm-0.08 mm, and optimally, T1=0.06 mm.

Further, the micro seam 140 is filled with a signal non-shielding material such as plastic or rubber. An exterior color of the signal non-shielding material is identical to that of the metal housing 11 so as to make the mobile terminal applying the antenna device 400 have a more holistic appearance.

Further, the micro seam band 14 further includes a frame strip 141 formed between the adjacent micro seams 140, and the frame strip 141 is made of the same material as the metal housing 11. In the present embodiment, the micro seam band 14 can be an integral structure including the micro seam 140 and the frame strip 141, and the micro seam band 14 can be embedded into the metal housing 11 in an inlaid manner so as to realize the partitioning function in the antenna device 400. In this case, the frame strip 141 can also be made of a material different from the metal housing 11, as long as the frame strip 141 has the same outer surface as the metal housing 11 in appearance. Certainly, in other embodiment, the metal housing 11 can be penetrated by laser cutting to form the micro seam 140, in which case the frame strip 141 is a portion of the metal housing 11 uncut by the laser, and the micro seam 140 and the frame strip 141 form the micro seam band 14 together. The plurality of the micro seams 140 are arranged spaced apart or arranged crosswise.

Further, the antenna device 400 further includes a rear cover (not illustrated), the rear cover is made of a signal shielding material and connected to the metal housing 11, and the rear cover is grounded, so as to increase a bandwidth of the first antenna 111. Preferably, the rear cover is made of the same material as the peripheral frame so that the electrical connection effect of the rear cover and the peripheral frame is better.

Referring to FIG. 6, as an optional embodiment, the at least two frame bodies of the antenna device 400 further includes a second antenna 112, that is, the other frame body is the second antenna 112. The antenna device 400 further includes a second matching circuit 122 and a second radio-frequency receiving and emitting circuit 132, the second matching circuit 122 is electrically coupled between the second antenna 112 and the second radio-frequency receiving and emitting circuit 132, and the second radio-frequency receiving and emitting circuit 132 and the first radio-frequency receiving and emitting circuit 131 are used to deal with different radio-frequency signals.

For example, the first radio-frequency receiving and emitting circuit 131 can be used to deal with functional signals such as GPS signals, Bluetooth signals or Wi-Fi signals, and the second radio-frequency receiving and emitting circuit 132 can also be used to deal with functional signals such as GPS signals, Bluetooth signals or Wi-Fi signals. The first radio-frequency receiving and emitting circuit 131 and the second radio-frequency receiving and emitting circuit 132 can deal with radio-frequency signals of the same signal types and different signal frequency bands, or the radio-frequency signals of different signal types.

In the present embodiment, the mobile terminal applying the antenna device 400 can have antennas of a plurality of functions, and the antennas of the plurality of functions are integrated into the same metal housing 11, which is beneficial for the multi-functionalization and microminiaturization design of the mobile terminal.

Referring to FIG. 6, preferably, four micro seam bands 14 can be arranged spaced apart in the metal housing 11 of the antenna device 400, the four micro seam bands 14 partition the metal housing 11 into four frame bodies independent from each other, and the four frame bodies form the first antenna 111, the second antenna 112, a third antenna 113 and a fourth antenna 114. The antenna device 400 further includes the first matching circuit 121, the second matching circuit 122, a third matching circuit 123, and a fourth matching circuit 124 as well as the first radio-frequency receiving and emitting circuit 131, the second radio-frequency receiving and emitting circuit 132, a third radio-frequency receiving and emitting circuit 133 and a fourth radio-frequency receiving and emitting circuit 134 used for dealing with different radio-frequency signals. The first matching circuit 121 is electrically coupled between the first antenna 111 and the first radio-frequency receiving and emitting circuit 131, the second matching circuit 122 is electrically coupled between the second antenna 112 and the second radio-frequency receiving and emitting circuit 132, the third matching circuit 123 is electrically coupled between the third antenna 113 and the third radio-frequency receiving and emitting circuit 133, and the fourth matching circuit 124 is electrically coupled between the fourth antenna 114 and the fourth radio-frequency receiving and emitting circuit 134. In the present embodiment, the antenna device 400 can deal with four different radio-frequency signals at the same time, which is beneficial for the multi-functionalization and microminiaturization design of the mobile terminal applying the antenna device 400. Certainly, in other examples, the number of the micro seam bands 14 can be set according to actual requirements.

Referring to FIG. 8 to FIG. 12 together, which is an antenna device 500 provided by the fourth embodiments of the present disclosure. The metal housing 1 in the antenna device 500 is the rear cover of the mobile terminal, which is adjacent to a battery and also named as a battery cover. The metal housing 1 includes a backboard 15 and a side frame 16 integrally connected to the backboard 15. The side frame 16 of the metal housing 1 includes the first long edge L1 and the second long edge L2 arranged opposite to each other and the first short edge S1 and the second short edge S2 arranged opposite to each other. The first short edge S1 and the second short edge S2 are connected between the first long edge L1 and the second long edge L2. The partitioning seam includes a first seam 11 and a first micro seam band 12, the first micro seam band 12 is communicated with the first seam 11 and a side edge of the metal housing 1 to form a first insulation section, so that the first insulation section partitions the metal housing 1 into two radiating parts. For ease of description, the two radiating parts herein includes a first radiating part 13 and a second radiating part 14, and the radiating circuit includes a first feeding point 2, a ground point 3 and a first matching circuit 4. The first feeding point 2 and the ground point 3 are provided in the second radiating part 14, and the first feeding point 2 is electrically coupled to the first radiating part 13 via the first matching circuit 4 to feed so as to make the first radiating part 13 form a radiating arm of the antenna device 500. The first radiating part 13 is electrically coupled to the ground point 3 to make the second radiating part 14 form a radiating ground. In such a way, electric current flows to the first radiating part 13 through the feeding point, and flows into the second radiating part 14 serving as the radiating ground from the first radiating part 13, so that a complete circuit-loop is formed and the metal housing 1 is realized to be the antenna device 500. Certainly, in other embodiments, the metal housing 1 can also be a flat and straight backboard 15.

Figure 8:
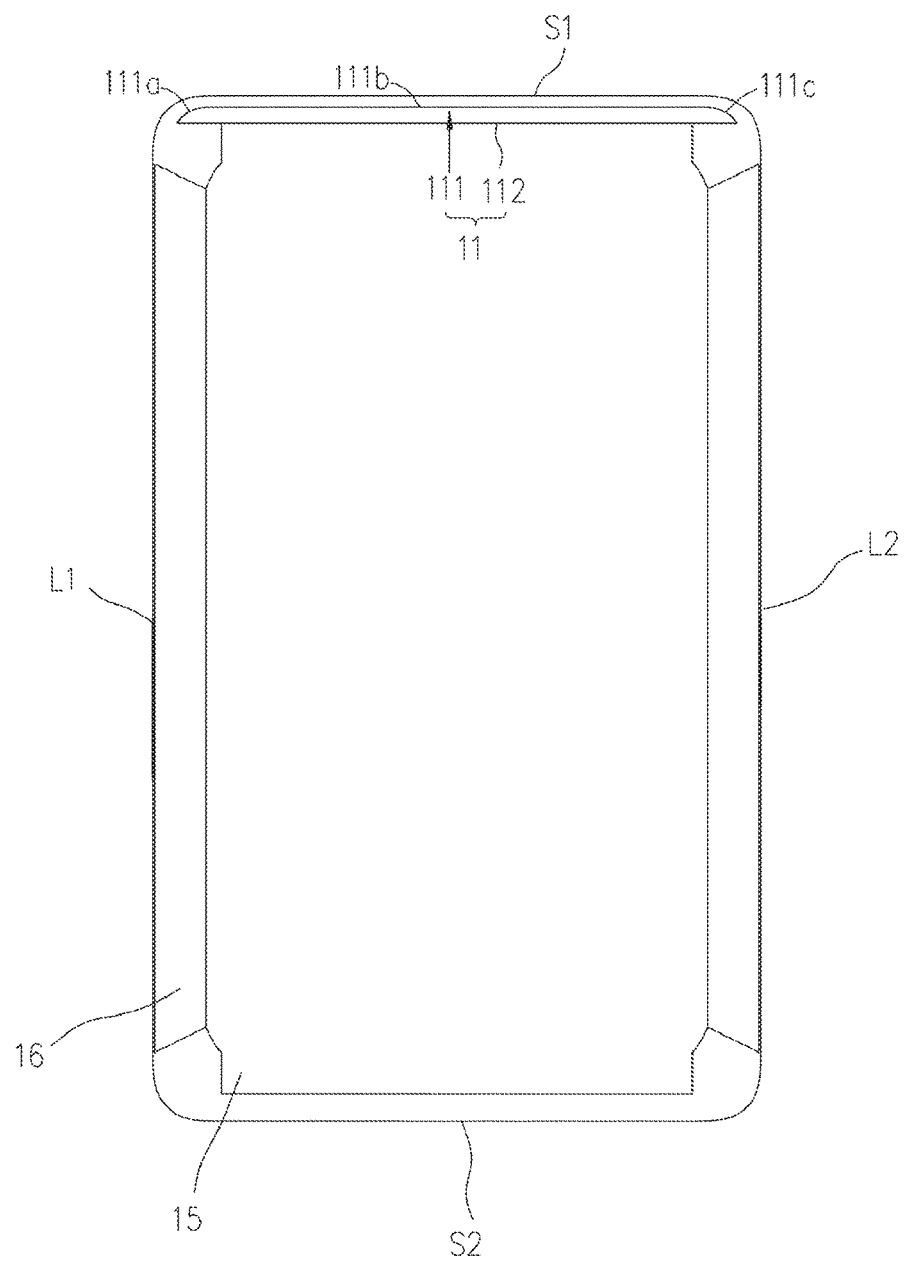
FIG. 8 is a schematic view of a metal housing provided in a fourth embodiment of the present disclosure.
Figure 8A:
FIG. 8a to FIG. 8f are schematic views of a first seam in FIG. 8 in different shapes.
Figure 8B:
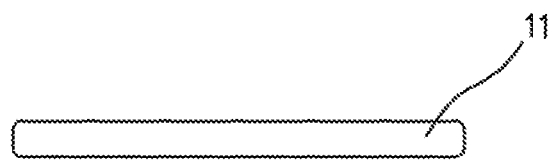
Figure 8C:
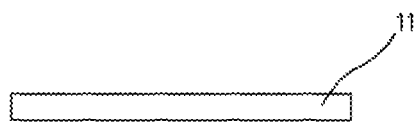
Figure 8D:
Figure 8E:
Figure 8F:
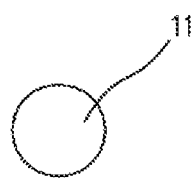

In the present embodiment, in order to improve the overall appearance of the metal housing 1, the first seam 11 includes an arc segment 111 and a straight-line segment 112 connected with two ends of the arc segment 111. Specifically, the arc segment 111 includes a first rounded section 111a, a straight section 111b and a second rounded section 111c connected sequentially, the straight-line segment 112 is connected to an end of the first rounded section 111a and an end of the second rounded section 111c. Certainly, in other embodiments, as illustrated in FIG. 8a, the first seam 11 can also be in a crescent shape; as illustrated in FIG. 8b, the first seam 11 can also have a shape of a long rectangle with round corners; as illustrated in FIG. 8c, the first seam 11 can also be rectangular; as illustrated in FIG. 8d, the first seam 11 can also be wavy; as illustrated in FIG. 8e, the first seam 11 can also be lightning-shaped; as illustrated in FIG. 8f, the first seam 11 can also be a circular hole and etc.

In the present embodiment, in order to enhance the metal texture of the metal housing 1, the seam width of the first seam 11 is smaller than or equal to 3 mm, which makes the first seam 11 invisible to naked eyes. The first seam 11 extends from the first long edge L1 to the second long edge L2, the first seam 11 is adjacent to the first short edge S1, and the first radiating part 13 is located between the first short edge S1 and the first seam 11. It could be understood that the first seam 11 can be arranged at a joint of the backboard 15 and the side frame 16 so as to further make the first seam 11 uneasy to observe and kept away from hands of the users, which improves the efficiency of the antenna device 500. The first seam 11 can also be arranged in the backboard 15. In this case, one first seam 11 is provided herein, but it could be understood that two first seams 11 can be provided, and the two first seams 11 are arranged in a mirroring manner in the metal housing 1 and are adjacent to the first short edge S1 and the second short edge S2 respectively. The structure of the metal housing 1 in the sixth embodiment of the present disclosure can be referred to for details. That is, the second seam 17 in the sixth embodiment in the present disclosure is equivalent to the first seam 11 in the embodiment of the present disclosure. Certainly, in other embodiments, the first seam 11 can also be adjacent to the second short edge S2.

In the present embodiment, two ends of the first micro seam band 12 cut off the side edge of the metal housing 1 and an edge of the first seam 11, and the side edge cut off is enabled to be communicated with the first seam 11 to form the first insulation section. The first micro seam band 12 includes a plurality of micro seams, and the plurality of micro seams is juxtaposed and spaced apart. The seam width of the micro seam is smaller than 0.5 mm so as to make the first micro seam band 12 invisible to naked eyes and improve a proportion of the metal in the metal housing 1 further. It could be understood that the first micro seam band 12 can further include one micro seam. It could be understood that the micro seam can be further filled with the signal non-shielding material, such as plastic or silica gel. Certainly, in other embodiments, the first micro seam band 12 can also be formed by a seam having a lager seam width, and for example the seam width is larger than 0.5 mm.

Several arrangement methods of the first micro seam band 12 in the metal housing 1 are as follows. Different position relationships among the first micro seam band 12, the feeding point and the ground point 3 also lead to different antenna forms.

Figure 9:
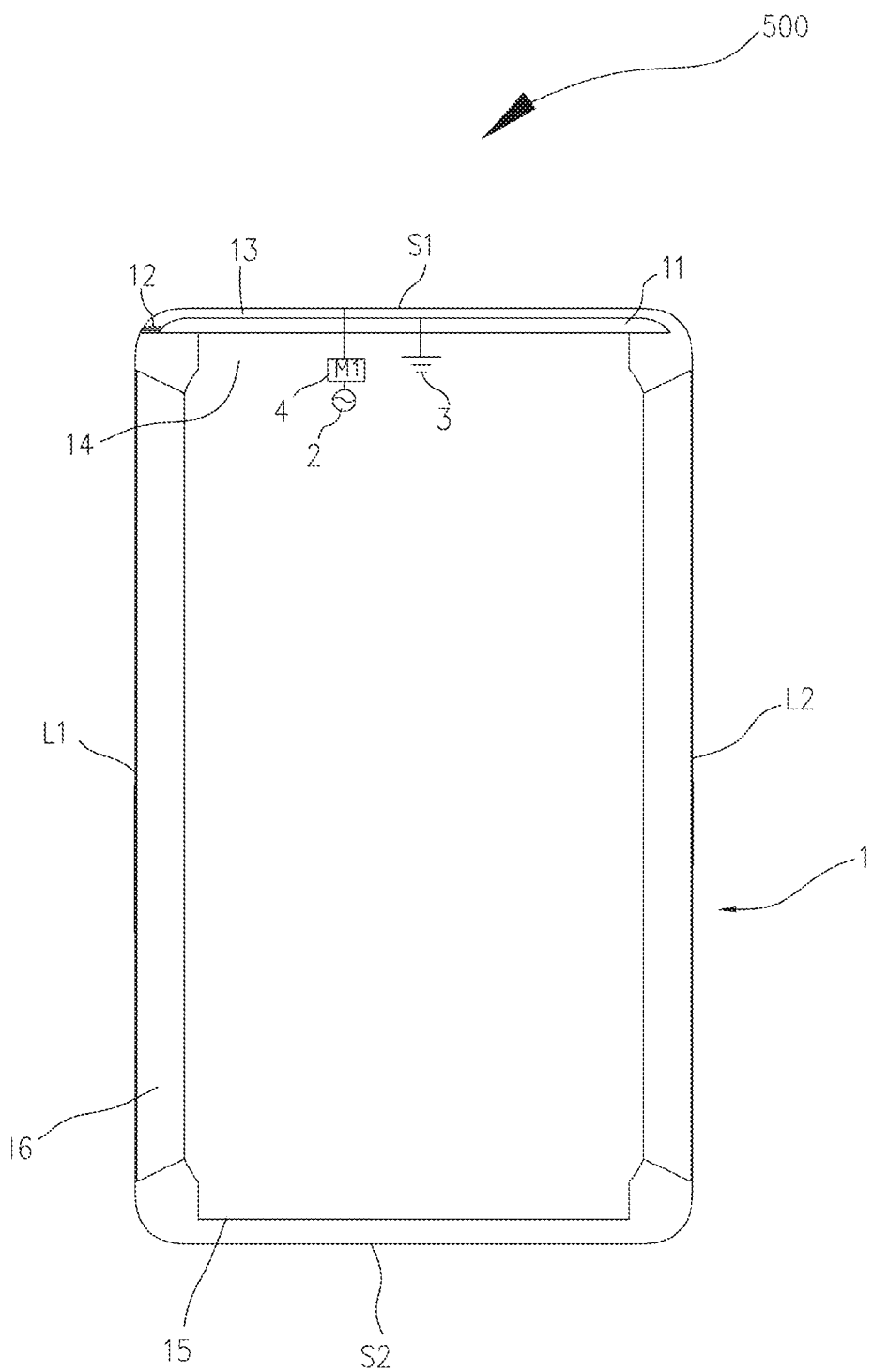
FIG. 9 is a schematic view of an antenna device provided in a first example of the fourth embodiment of the present disclosure.
Figure 10:
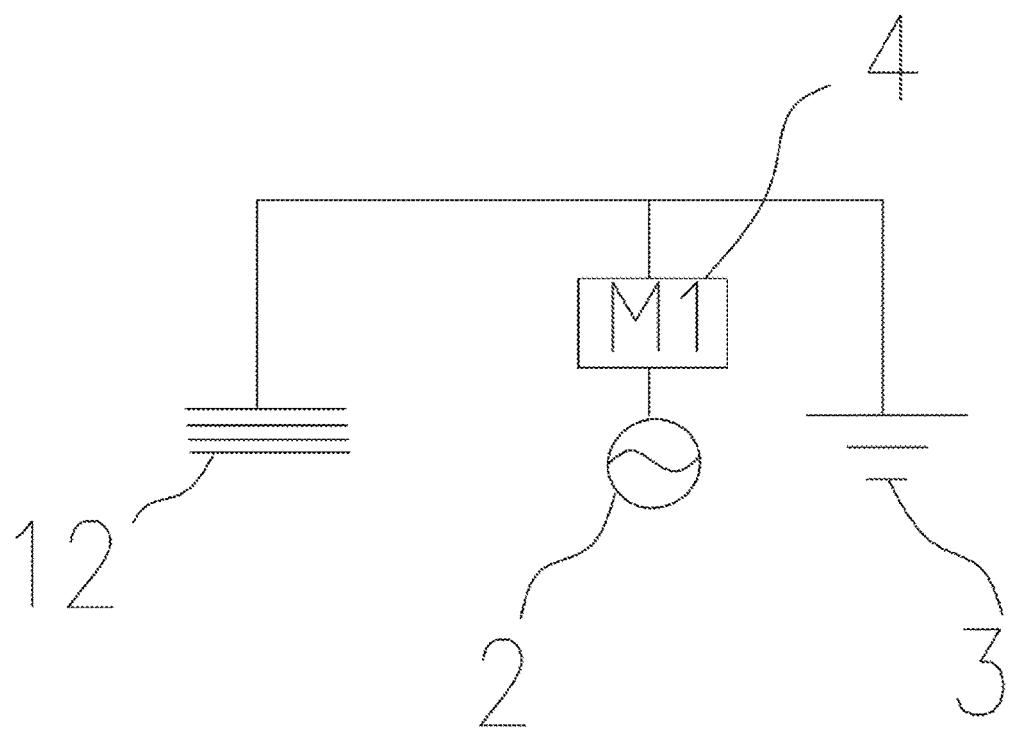
FIG. 10 is a circuit diagram of the antenna device illustrated in FIG. 9.

In the first example, referring to FIG. 9, the first micro seam band 12 is communicated with the first long edge L1 and the first seam 11, and the first matching circuit 4 is located between the ground point 3 and the first micro seam band 12. Specifically, the first insulation section is parallel with the first short edge S1 and cuts off the first long edge L1, that is, the radiating arm from the first micro seam band 12 to the ground point 3 is formed in the first radiating part 13; the first matching circuit 4 is more adjacent to the ground point 3 compared with the first micro seam band 12; and the antenna device 500 of a F-type antenna is formed. Referring to FIG. 10, the circuit is such that the electric current flows through the first radiating part 13 from the first feeding point 2, the electric current in the first radiating part 13 is divided into two flows of electric current, one is grounded and the other flows to the first micro seam band 12, that is, the first micro seam band 12 plays a role of insulation herein, preventing the electric current flowing through it from continuing flowing and radiating the electric current out. Certainly, in other embodiments, two or three or other number of first micro seam bands can be provided, which are arranged correspondingly according the requirements of the first radiating part 13. For example, two first micro seam bands 12 can be provided, one first micro seam bands 12 is communicated with the first long edge L1 and the first seam 11, and the other first micro seam band 12 is communicated with the first short edge S1 and the first seam 11, or the other first micro seam band 12 is communicated with the second long edge L2 and the first seam 11. The first matching circuit 4, the first feeding point 2 and the ground point 3 can be located between the two first micro seam bands 12.

Figure 11:
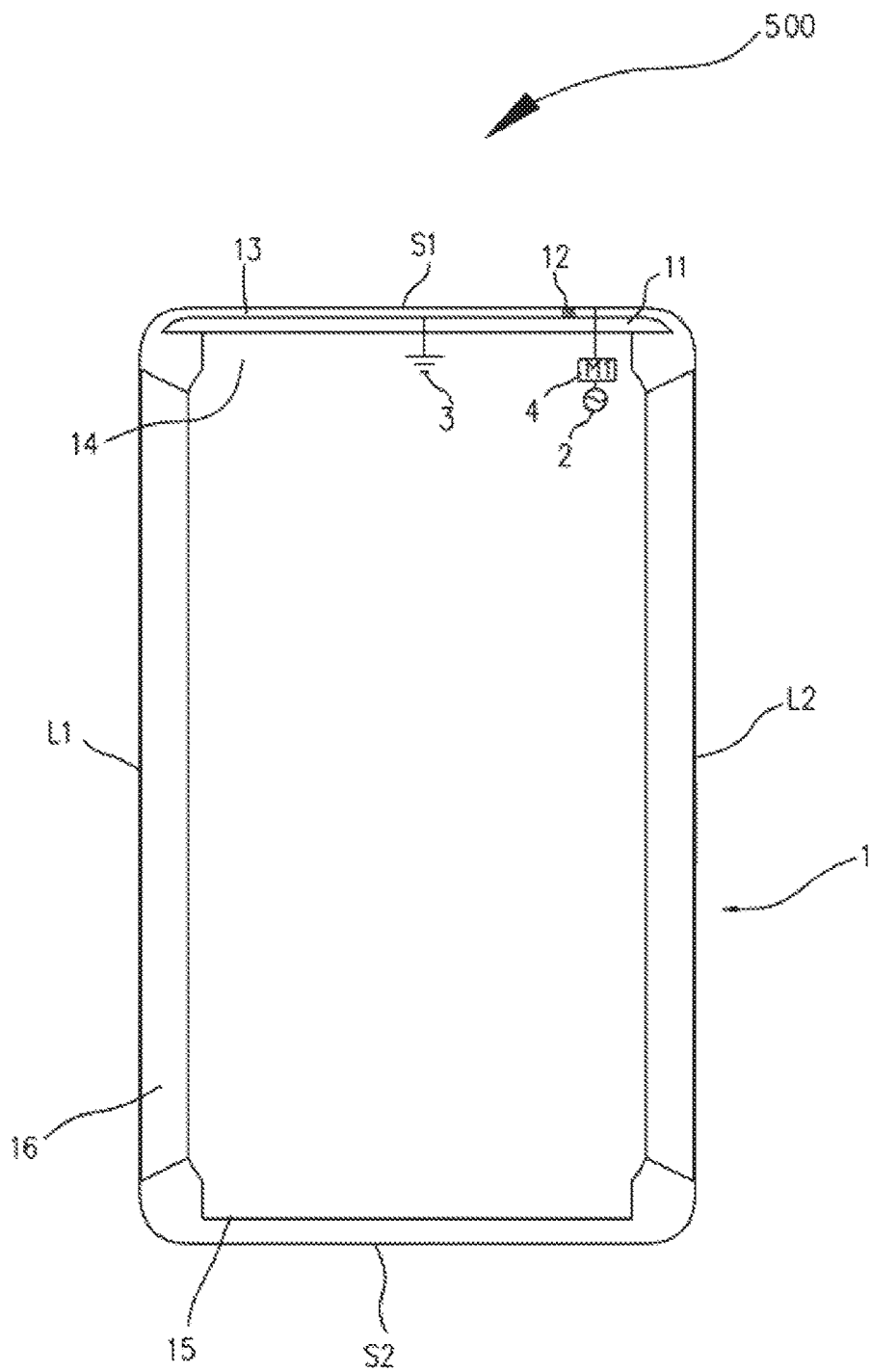
FIG. 11 is a schematic view of an antenna device provided in a second example of the fourth embodiment of the present disclosure.
Figure 12:
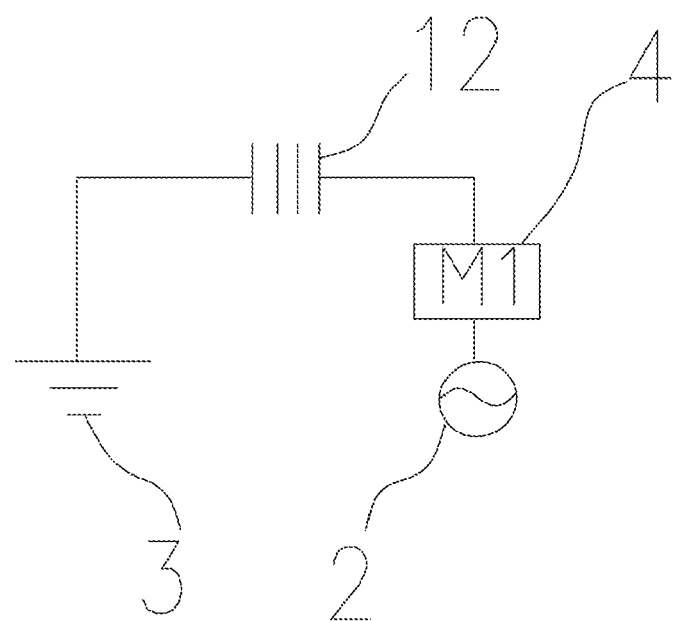
FIG. 12 is a circuit diagram of the antenna device illustrated in FIG. 11.

In the second example, referring to FIG. 11, the first micro seam band 12 is communicated with the first short edge S1 and the first seam 11, and the first micro seam band 12 is located between the first matching circuit 4 and the ground point 3. Specifically, the first micro seam band 12 is adjacent to the second long edge L2 (certainly, the first micro seam band 12 can also be adjacent to the first long edge L1), the first insulation section forms to be substantially L-shaped, and the first matching circuit 4 is more adjacent to the second long edge L2 compared with the first micro seam band 12, which makes the first micro seam band 12 located between the first matching circuit 4 and the ground point 3, such that the antenna device 500 of the LOOP-type antenna is formed. Referring to FIG. 12, the circuit is such that the electric current flows through the first radiating part 13 from the first feeding point 2, the electric current in the first radiating part 13 flows towards the first micro seam band 12, and then flows to the ground point 3 after being excited by the first micro seam band 12 acting as the capacitor. It can be seen that functions of the first micro seam band 12 herein differs from functions of the first micro seam band 12 in the above-mentioned embodiment according to different antenna forms arranged in the first seam 11.

In summary, the antenna device 500 is described as above, in which the first seam 11 of the metal housing 1 is arranged to have only one antenna form.

Figure 13:
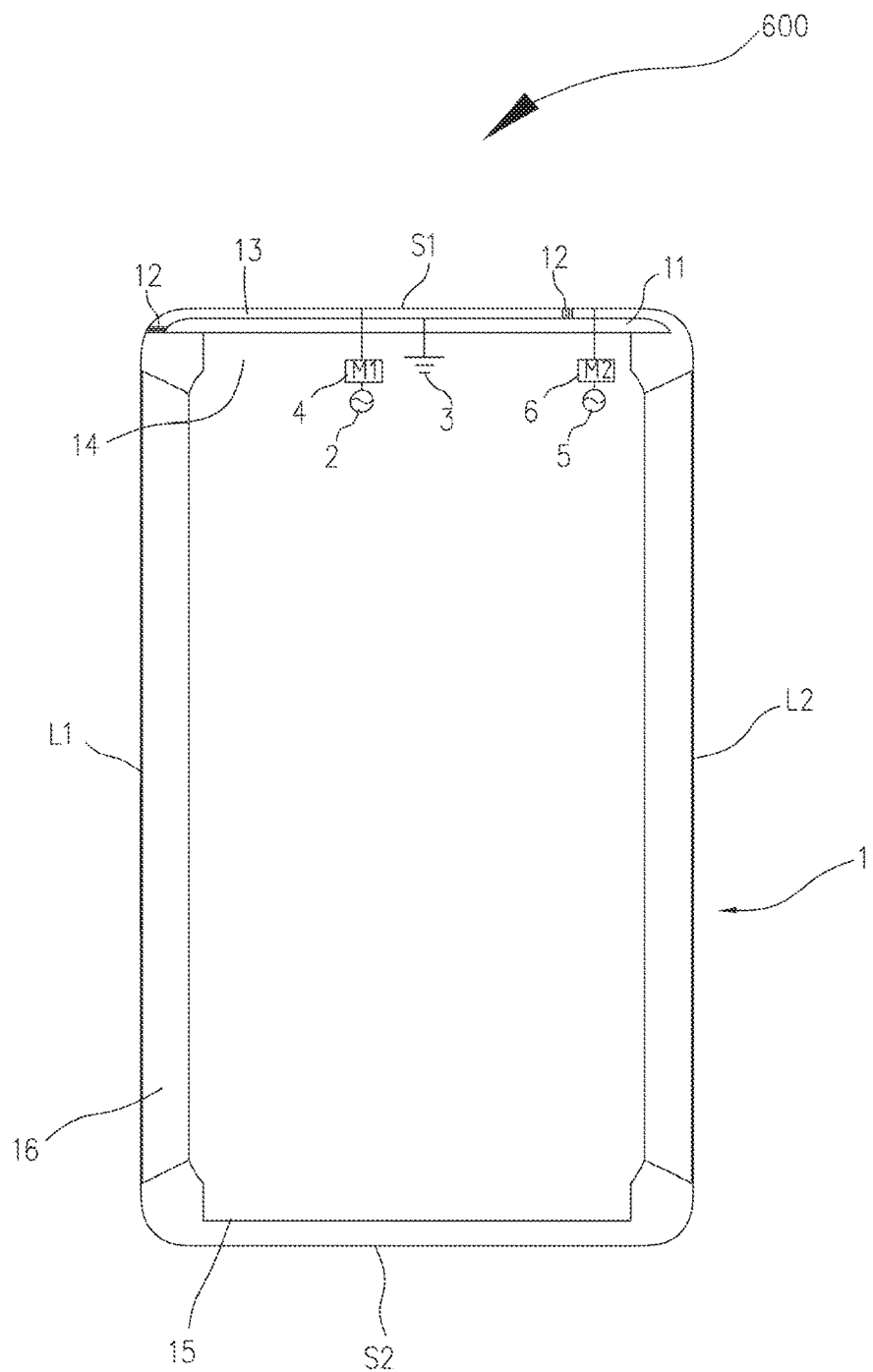
FIG. 13 is a schematic view of an antenna device provided in a first example of a fifth embodiment of the present disclosure.
Figure 14:
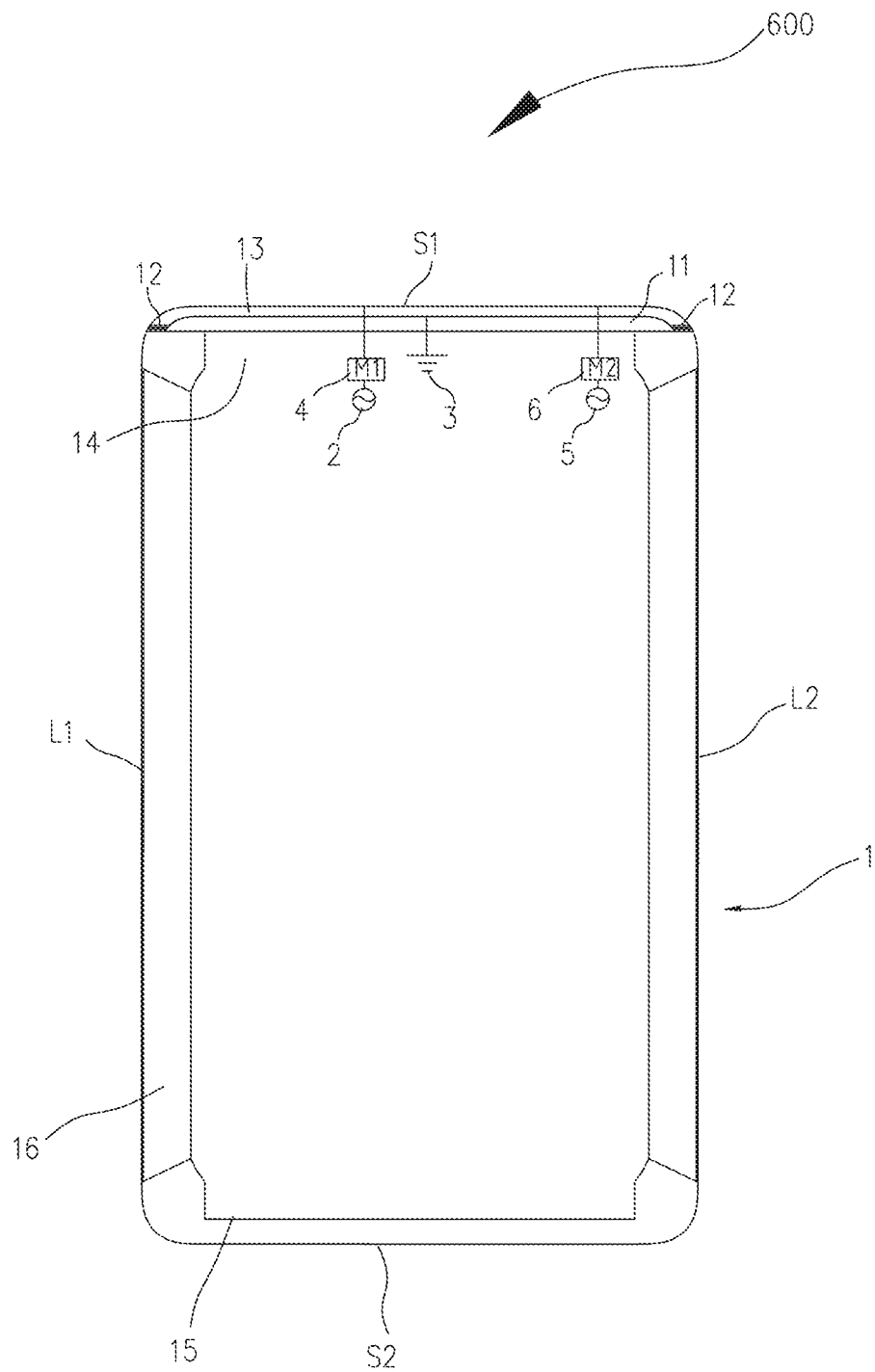
FIG. 14 is a schematic view of an antenna device provided in a second example of the fifth embodiment of the present disclosure.

Referring to FIGS. 13 and 14, which is an antenna device 600 according to the fifth embodiment of the present disclosure, the antenna device 600 is the substantially same as the antenna device 500 in the fourth embodiment, and the difference is that the first seam 11 of the metal housing 1 in the present embodiment is arranged so that the antenna device 600 has two antenna forms.

In the first example, referring to FIG. 13, the radiating circuit further includes a second matching circuit 6 and a second feeding point 5 electrically coupled to the first radiating part 13 via the second matching circuit 6. Two first micro seam bands 12 are provided, one of the two first micro seam bands 12 is communicated with the first long edge L1 and the first seam 11, and the first matching circuit 4 is located between the ground point 3 and the said first micro seam band 12; and the other first micro seam band 12 is communicated with the first short edge S1 and the first seam 11, and the other first micro seam band 12 is located between the second matching circuit 6 and the ground point 3. Specifically, two antennas are provided in the first seam 11, one is the F-type antenna arranged in the first seam 11 provided in the fourth embodiment, and the other is the LOOP-type antenna arranged in the first seam 11 provided in the fourth embodiment, that is, the F-type antenna and the LOOP-type antenna are both arranged in the first seam 11 in the present embodiment, so as to meet the demand of each component in the mobile terminal for different bandwidths further. The arrangements of the F-type antenna and the LOOP-type antenna can refer to two examples of the fourth embodiment for details, which will not be repeated here.

In the second example, referring to FIG. 14, the radiating circuit further includes the second matching circuit 6 and the second feeding point 5 electrically coupled to the first radiating part 13 via the second matching circuit 6; two first micro seam bands 12 are provided, one of the two first micro seam bands 12 is communicated with the first long edge L1 and the first seam 11 and the first matching circuit 4 is located between the ground point 3 and the said first micro seam band 12, and the other first micro seam band 12 is communicated with the second long edge L2 and the first seam 11 and the second matching circuit 6 is located between the other first micro seam band 12 and the ground point 3. Specifically, the position relationship among the one first micro seam band 12, the first matching circuit 4 and the ground point 3 in the first seam 11 forms the F-type antenna, and the arrangement of the F-type antenna can refer to the first example in the fourth embodiment for details. The second matching circuit 6 is more adjacent to the first long edge L1 compared with the ground point 3, but the second matching circuit 6 is also located between the ground point 3 and the other first micro seam band 12, that is, the other micro seam band, the second matching circuit 6 and the ground point 3 also form the F-type antenna in the first seam 11. In summary, the first seam 11 of the metal housing 1 is arranged to form the antenna device 600 having two F-type antennas.

Referring to FIGS. 15 to 19, which is an antenna device 700 according to the sixth embodiment of the present disclosure, the antenna device 700 is the substantially same as the antenna device 600 in the fifth embodiment, and the differences lie in that the partitioning seam further includes a second seam 17 and a second micro seam band 18, and the radiating circuit further includes a third matching circuit 8 and a third feeding point 7. The second micro seam band 18 is communicated with the second seam 17 and the side edge of the metal housing separately so as to form a second insulation section, so that the first insulation section and the second insulation section partition the metal housing 1 into the first radiating part 13, the second radiating part 14 and a third radiating part 19. The second seam 17 extends from the first long edge L1 to the second long edge L2, the second seam 17 is adjacent to the second short edge S2, and the third radiating part 19 is located between the second short edge S2 and the second seam 17, the third feeding point 7 is electrically coupled to the third radiating part 19 via the third matching circuit 8, and the third radiating part 19 is electrically coupled to the second radiating part 14. Specifically, the first insulation section and the second insulation section partition the metal housing 1 into three radiators, and by providing the ground point 3, the second radiating part 14 becomes the radiating ground of each antenna formed in the metal housing 1. It could be understood that the second seam 17 and the first seam 11 have the same structure as each other, and the second micro seam band 18 and the first micro seam band 12 have the same structure as each other.

Several arrangement methods of the second micro seam band 18 in the metal housing 1 are as follows. Different position relationships among the second micro seam band 18, the feeding point and the ground point 3 also lead to different antenna forms.

Figure 15:
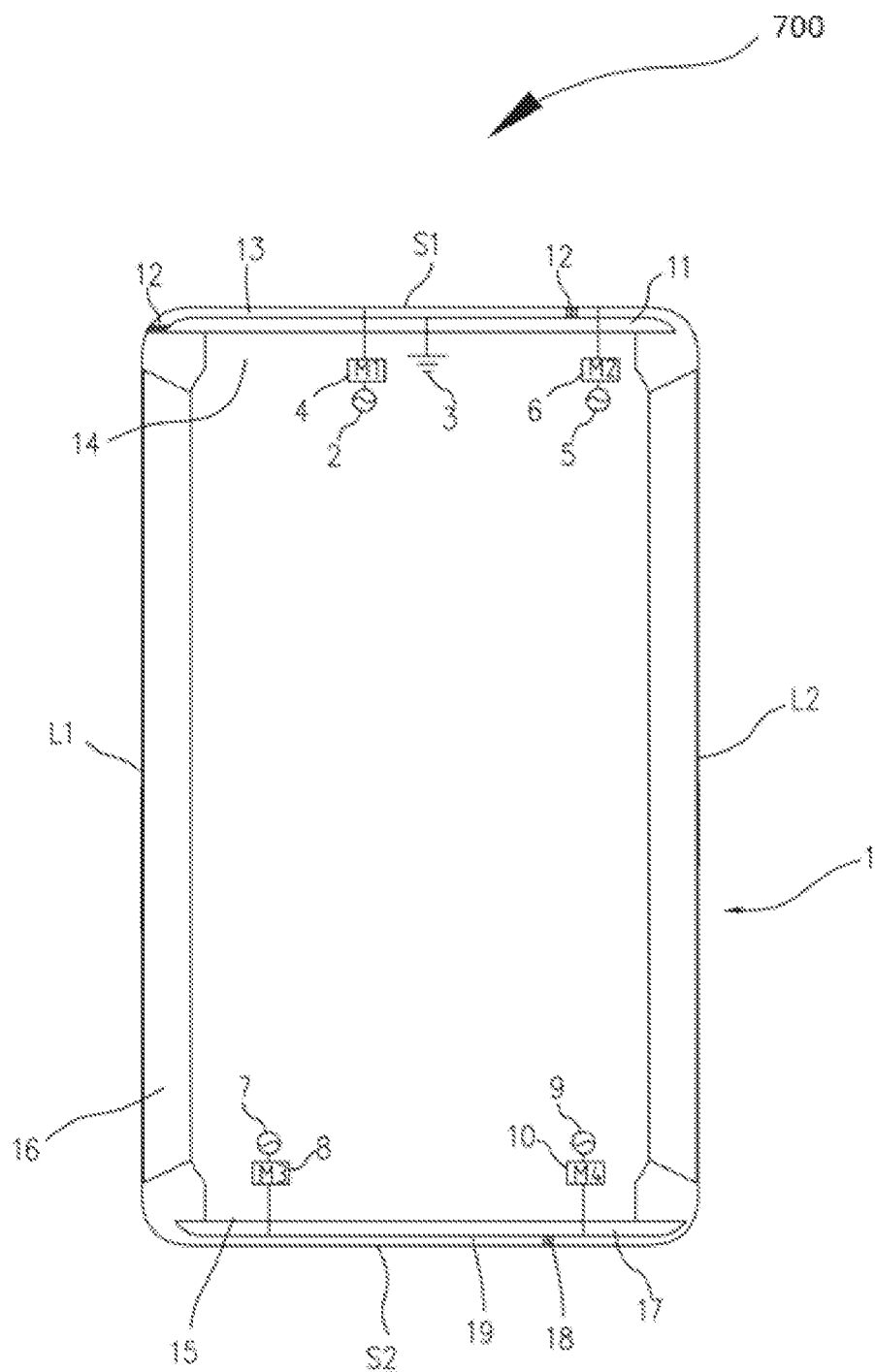
FIG. 15 is a schematic view of an antenna device provided in a first example of a sixth embodiment of the present disclosure.

In the first example, referring to FIG. 15, the arrangement method of the antenna in the first seam 11 is preferably the first example of the antenna device 600 in the fifth embodiment, which has a plurality of bandwidths, thereby further improving the antenna performance of the antenna device 700. Certainly, in other embodiments or examples, the arrangement method of the antenna in the first seam 11 can also be the arrangement method of the antenna or implementation manner of antenna devices in other embodiments or examples of the specification without conflicting with each other.

Figure 16:
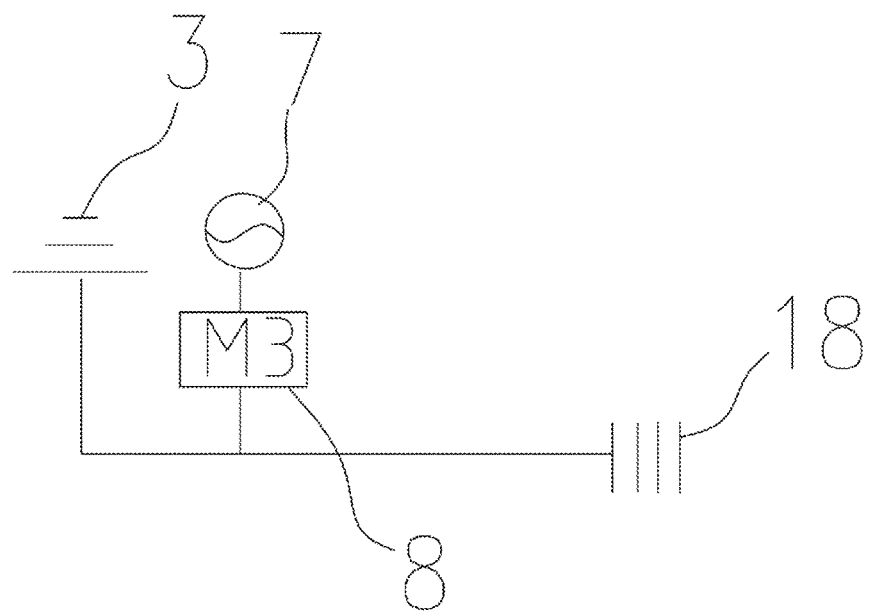
FIG. 16 is a circuit diagram corresponding to a third matching circuit in FIG. 15.

The second micro seam band 18 is communicated with the second short edge S2 and the second seam 17, and the third matching circuit 8 is located between the ground point 3 and the second micro seam band 18. Specifically, the second micro seam band 18 is adjacent to the second long edge L2, and the third matching circuit 8 is adjacent to the first long edge L1. Referring to FIG. 16, as the second radiating part 14 serves as the radiating ground, the electric current flows from the third feeding point 7 and through the third matching circuit 8 to the third radiating part 19, the electric current is divided into two flows of electric currents, one flows towards the first long edge L1 to enter the second radiating part 14, and the other flows towards the second micro seam band 18 to form an inverse F-type antenna, in which case the second micro seam band 18 plays a role of insulation and prevents the electric current flowing through it from continuing flowing, and the electric current is radiated out.

Figure 17:
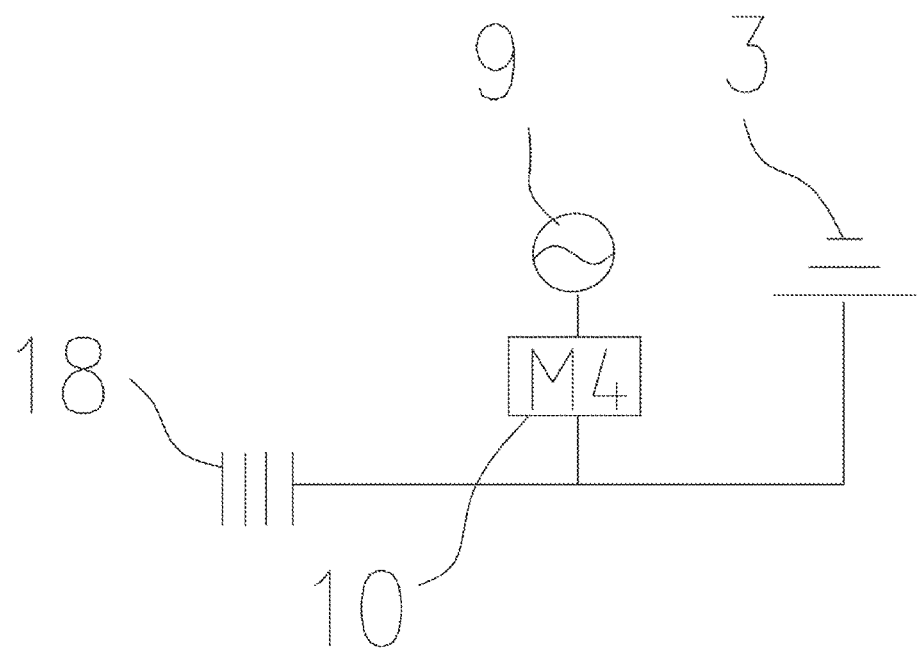
FIG. 17 is a circuit diagram corresponding to a fourth matching circuit in FIG. 15.

Further, the radiating circuit further includes a fourth matching circuit 10 and a fourth feeding point 9 electrically coupled to the third radiating part 19 via the fourth matching circuit 10, the fourth matching circuit 10 is located between the second micro seam band 18 and the ground point 3, and the second micro seam band 18 is located between the third matching circuit 8 and the fourth matching circuit 10. Specifically, the second micro seam band 18 is adjacent to the fourth matching circuit 10, and the fourth matching circuit 10 is adjacent to the second long edge L2. Referring to FIG. 17, the second radiating part 14 is the radiating ground of each antenna, so the second long edge L2 is grounded, and hence the fourth matching circuit 10 is located between the second micro seam band 18 and the second long edge L2 being grounded, which also forms the inverse F-type antenna. Different from the above-mentioned inverse F-type antenna, as the second micro seam band 18 is more adjacent to the fourth matching circuit 10, the radiating arm corresponding to the third matching circuit 8 is longer than the radiating arm of the fourth matching circuit 10, and the bandwidths of the two kinds of inverse F-type antennas are different, which can meet the demand of each component in the mobile terminal for the bandwidth further. Certainly, in other embodiments, the second micro seam band 18 can be more adjacent to the third matching circuit 8.

Figure 18:
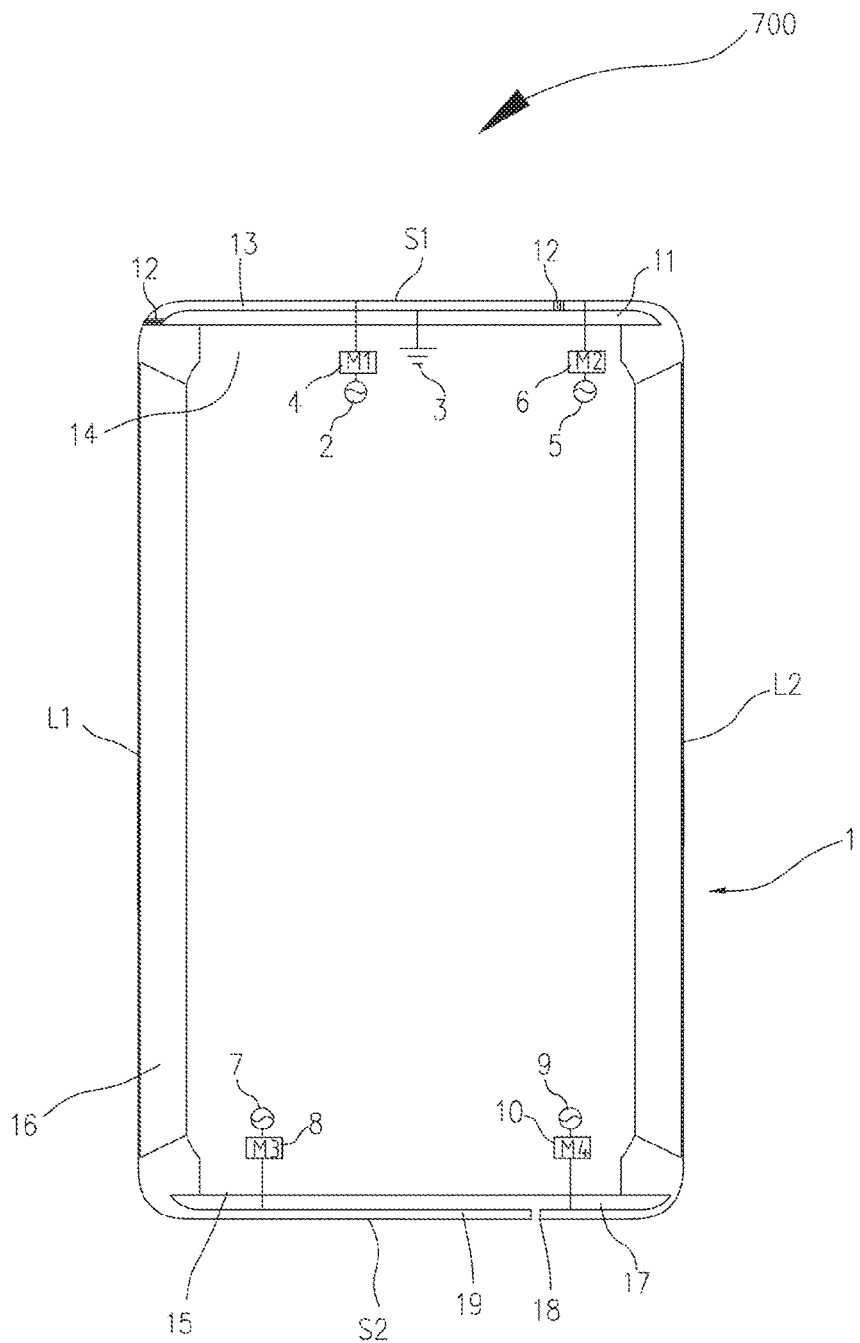
FIG. 18 is a schematic view in which a second micro seam band in FIG. 15 is an earphone jack.

Further, referring to FIG. 18, the second micro seam band 18 can be replaced by an earphone jack provided in the second short edge S2, as long as the second seam 17 can be divided into two parts.

Figure 19:
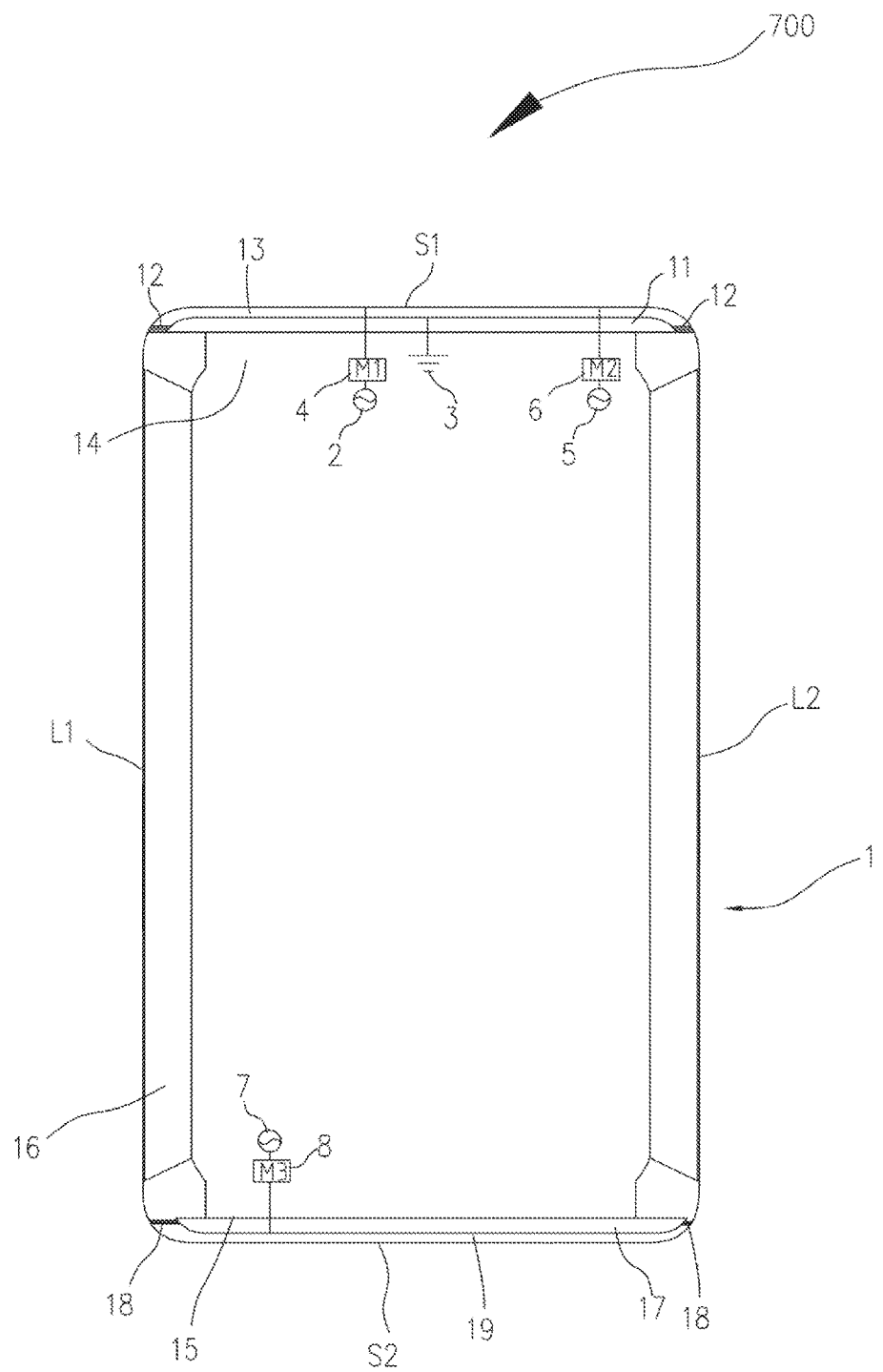
FIG. 19 is a schematic view of an antenna device provided in a second example of the sixth embodiment of the present disclosure.

In the second example, referring to FIG. 19, the arrangement method of the antenna in the first seam 11 is preferably the second example of the antenna device 600 in the fifth embodiment, which has a plurality of bandwidths, thereby improving the antenna performance of the antenna device 700 further. Certainly, in other embodiments or examples, the arrangement method of the antenna in the first seam 11 can also be the arrangement method of the antenna or implementation manner of antenna devices in other embodiments or examples of the specification without conflicting with each other.

Two second micro seam bands 18 are provided, one is communicated with the first long edge L1 and the second seam 17, the other is communicated with the second long edge L2 and the second seam 17, and the third matching circuit 8 is located between the two second micro seam bands 18. Specifically, the two second micro seam bands 18 and the second seam 17 form the second insulation section parallel with the second short edge S2, and the whole third radiating part 19 forms the radiating arm of the antenna. The electric current flows towards the third radiating part 19 through the third feeding point 7 and the third matching circuit 8, and is divided into two flows of electric currents which flow to the two second micro seam bands 18 respectively. In summary, three types of antennas are formed in the metal housing 1 in the present embodiment.

It could be understood that, an antenna body is directly coupled to the metal housing 1.

It could be understood that a feeding mode of the antenna in the metal housing 1 can be direct feeding or coupled feeding.

In the antenna device 500, 600, and 700, the metal housing 1 is partitioned into the first radiating part 13 and the second radiating part 14 by the first insulation section formed by the first seam 11 and the first micro seam band 12, and the first feeding point 2 is electrically coupled to the first radiating part 13 via the first matching circuit 4 to perform feeding, so that the first radiating part 13 becomes the radiating arm of the antenna device 500, 600, 700. The first radiating part 13 is electrically coupled to the ground point 3 so that the second radiating part 14 forms the radiating ground, such that the metal housing 1 forms the antenna device 500, 600, 700. By making use of the structure of the metal housing 1 of the mobile terminal, the antenna device 500, 600, 700 has a large radiating area and does not need any additional antenna radiator, which not only improves the radiation efficiency of the antenna device 500, 600, and 700, but also enables an overall structure of the mobile terminal to be simplified, thus facilitating the cost reduction of the mobile terminal.

The embodiments of the present disclosure are described in detail above. Specific examples are used herein to describe the principles and embodiments of the present disclosure. The description of the above embodiments is merely used to help understand the method and core idea of the present disclosure. Meanwhile, those of ordinary skill in the art, based on the idea of the present disclosure, may make changes in the specific embodiments and application scopes. In summary, the content of the present specification should not be construed as a limitation on the present disclosure.

What is claimed is:

1. An antenna device, comprising
a peripheral frame, the peripheral frame being made of a signal shielding material and formed to be end-to-end, the peripheral frame being provided with at least two micro seam bands, the at least two micro seam bands partitioning the peripheral frame into at least two frame bodies independent from each other, the at least two frame bodies comprising a first antenna, each of the at least two micro seam bands having at least one micro seam, and a width of the micro seam being smaller than or equal to 0.2 mm;
a first matching circuit, the first matching circuit being electrically coupled to the first antenna; and
a first radio-frequency receiving and emitting circuit, the first radio-frequency receiving and emitting circuit being electrically coupled to the first matching circuit;
wherein the at least two frame bodies further comprises a second antenna, the antenna device further comprises a second matching circuit and a second radio-frequency receiving and emitting circuit, the second matching circuit is electrically coupled between the second antenna and the second radio-frequency receiving and emitting circuit, and the second radio-frequency receiving and emitting circuit and the first radio-frequency receiving and emitting circuit are configured to deal with different radio-frequency signals, such that the antenna device integrates multiple functional antennas on the same peripheral frame;
wherein each of the at least two micro seam bands further comprises a frame strip formed between adjacent micro seams, each of the at least two micro seam bands is an integral structure comprising both the frame strip and the micro seam, and each of the at least two micro seam bands is embedded in the peripheral frame;
wherein the frame strip is made of the same material as the peripheral frame;
wherein the antenna device further comprises a switch, the switch comprises a first end and a second end, the first end is connected to one of the at least two frame bodies, and the second end is connected to the frame strip.

2. The antenna device according to claim 1, wherein the signal shielding material is metal.

3. The antenna device according to claim 1, wherein the width of the micro seam is larger than or equal to 0.1 mm.

4. The antenna device according to claim 3, wherein the micro seam is filled with a signal non-shielding material.

5. The antenna device according to claim 1, wherein at least two micro seams are provided, and a distance between the adjacent two micro seams is larger than or equal to the width of the micro seam.

6. The antenna device according to claim 5, wherein a ratio of the distance between the adjacent micro seams to the width of the micro seam is larger than or equal to 1.2.

7. The antenna device according to claim 6, wherein the ratio of the distance between the adjacent micro seams to the width of the micro seam is larger than or equal to 2.

8. The antenna device according to claim 7, wherein the width of the micro seam is smaller than or equal to 0.12 mm.

9. The antenna device according to claim 7, wherein the micro seam is filled with a signal non-shielding material.

10. The antenna device according to claim 6, wherein the width of the micro seam is smaller than or equal to 0.12 mm.

11. The antenna device according to claim 6, wherein the micro seam is filled with a signal non-shielding material.

12. The antenna device according to claim 5, wherein the width of the micro seam is smaller than or equal to 0.12 mm.

13. The antenna device according to claim 5, wherein the micro seam is filled with a signal non-shielding material.

14. The antenna device according to claim 1, wherein the antenna device further comprises a rear cover, the rear cover is made of a signal shielding material and connected to the peripheral frame, and the rear cover is grounded, so as to increase a bandwidth of the first antenna.

15. The antenna device according to claim 14, wherein the rear cover is made of the same material as the peripheral frame.

16. The antenna device according to claim 1, wherein at least two micro seams are provided and arranged crosswise.

17. A mobile terminal comprising an antenna device, the antenna device comprising:
a peripheral frame, the peripheral frame being made of a signal shielding material and formed to be end-to-end, the peripheral frame being provided with at least two micro seam bands, the at least two micro seam bands partitioning the peripheral frame into at least two frame bodies independent from each other, the at least two frame bodies comprising a first antenna, each of the at least two micro seam bands having at least one micro seam, and a width of the micro seam being smaller than or equal to 0.2 mm;
a first matching circuit, the first matching circuit being electrically coupled to the first antenna; and
a first radio-frequency receiving and emitting circuit, the first radio-frequency receiving and emitting circuit being electrically coupled to the first matching circuit;
wherein the at least two frame bodies further comprises a second antenna, the antenna device further comprises a second matching circuit and a second radio-frequency receiving and emitting circuit, the second matching circuit is electrically coupled between the second antenna and the second radio-frequency receiving and emitting circuit, and the second radio-frequency receiving and emitting circuit and the first radio-frequency receiving and emitting circuit are configured to deal with different radio-frequency signals, such that the antenna device integrates multiple functional antennas on the same peripheral frame;
wherein each of the at least two micro seam bands further comprises a frame strip formed between adjacent micro seams, each of the at least two micro seam bands is an integral structure comprising both the frame strip and the micro seam, and t each of the at least two micro seam bands is embedded in the peripheral frame;
wherein the frame strip is made of the same material as the peripheral frame;
wherein the antenna device further comprises a switch, the switch comprises a first end and a second end, the first end is connected to one of the at least two frame bodies, and the second end is connected to the frame strip.

18. An antenna device, comprising
a peripheral frame, the peripheral frame being made of a signal shielding material and formed to be end-to-end, the peripheral frame being provided with at least two micro seam bands, the at least two micro seam bands partitioning the peripheral frame into at least two frame bodies independent from each other, the at least two frame bodies comprising a first antenna, each of the at least two micro seam bands having at least one micro seam, and a width of the micro seam being smaller than or equal to 0.2 mm;
a first matching circuit, the first matching circuit being electrically coupled to the first antenna; and
a first radio-frequency receiving and emitting circuit, the first radio-frequency receiving and emitting circuit being electrically coupled to the first matching circuit;
wherein the at least two frame bodies further comprises a second antenna, the antenna device further comprises a second matching circuit and a second radio-frequency receiving and emitting circuit, the second matching circuit is electrically coupled between the second antenna and the second radio-frequency receiving and emitting circuit, and the second radio-frequency receiving and emitting circuit and the first radio-frequency receiving and emitting circuit are configured to deal with different radio-frequency signals, such that the antenna device integrates multiple functional antennas on the same peripheral frame;
wherein each of the at least two micro seam bands further comprises a frame strip, the micro seam is formed by cutting the peripheral frame by means of laser, and the frame strip is a portion of the peripheral frame uncut by the laser;
wherein the frame strip is made of the same material as the peripheral frame;
wherein the antenna device further comprises a switch, the switch comprises a first end and a second end, the first end is connected to one of the at least two frame bodies, and the second end is connected to the frame strip.

* * * * *